US009509311B2

(12) United States Patent
Yoon

(10) Patent No.: US 9,509,311 B2
(45) Date of Patent: Nov. 29, 2016

(54) SEMICONDUCTOR DEVICE AND OPERATION METHOD THEREOF

(71) Applicant: SK hynix Inc., Gyeonggi-do (KR)

(72) Inventor: Young-Jun Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 171 days.

(21) Appl. No.: 14/308,405

(22) Filed: Jun. 18, 2014

(65) Prior Publication Data

US 2015/0229299 A1    Aug. 13, 2015

(30) Foreign Application Priority Data

Feb. 7, 2014  (KR) .................. 10-2014-0014063

(51) Int. Cl.
*H03L 7/00* (2006.01)
*H03K 19/0185* (2006.01)

(52) U.S. Cl.
CPC ............ *H03K 19/018592* (2013.01)

(58) Field of Classification Search
CPC ............ H03K 17/223; H03K 17/22; H03K 3/356008; G06F 1/24; G11C 5/143
USPC ................................ 327/141–143
See application file for complete search history.

(56) References Cited

U.S. PATENT DOCUMENTS

| 6,539,511 B1* | 3/2003 | Hashizume ........ G01R 31/3004 714/726 |
| 2012/0039413 A1* | 2/2012 | Cui ....................... H04L 7/0008 375/295 |

FOREIGN PATENT DOCUMENTS

| KR | 1020020085953 | 11/2002 |
| KR | 1020110035750 | 4/2011 |

* cited by examiner

*Primary Examiner* — Lincoln Donovan
*Assistant Examiner* — Diana J Cheng
(74) *Attorney, Agent, or Firm* — IP & T Group LLP

(57) ABSTRACT

A semiconductor device includes a driving unit suitable for driving a plurality of signal lines, which are directly coupled to a plurality of bump pads, to a preset voltage level in a level determination period, and adjusting the preset voltage level in a predetermined order when the level determination period is repeated, a signal input circuit suitable for receiving voltage levels that are inputted through the signal lines and determining logic values for the inputted voltage levels of the signal lines, and an operation unit suitable for receiving voltage levels of the signal lines from the signal input circuit in a parallel manner in the level determination period, latching the logic values of the voltage levels, and serially outputting the logic values through a probe pad.

17 Claims, 9 Drawing Sheets

SEMICONDUCTOR DEVICE AND OPERATION METHOD THEREOF

CROSS-REFERENCE TO RELATED APPLICATIONS

The present application claims priority of Korean Patent Application No. 10-2014-0014063, filed on Feb. 7, 2014, which is incorporated herein by reference in its entirety.

BACKGROUND

1. Field

Exemplary embodiments of the present invention relate to a semiconductor design technology, and more particularly, to a semiconductor device that inputs/outputs a signal through a plurality of bump pads.

2. Description of the Related Art

Generally, signals used in a semiconductor device may be classified into analog signals, where the signal is expressed a continuous voltage level, and digital signals, where the signal is expressed in discrete logic values.

As a reference for determining the logic level of the digital signal, a low sensing voltage level VIL and a high sensing voltage level VIH are used. That is, a digital signal having a voltage level lower than the low sensing voltage level VIL is determined as logic 'low' (i.e., '0') and a digital signal having a voltage level higher than the high sensing voltage level VIH is determined as logic 'high' (i.e., '1').

The logic level of a signal applied to the semiconductor device from an exterior is determined by a signal input circuit. That is, the logic level of the signal applied to the semiconductor device from an exterior is determined based on a low sensing voltage level VIL and a high sensing voltage level VIH, which are set by the signal input circuit.

Accordingly, it may be important to test whether the signal input circuit of the semiconductor device has an appropriately adjusted low sensing voltage level VIL and high sensing voltage level VIH.

SUMMARY

Various embodiments are directed to a circuit capable of testing a state of a signal input circuit electrically coupled to a bump pad in a semiconductor device that inputs/outputs a signal by using the bump pad.

In an embodiment, a semiconductor device may include: a driving unit suitable for driving a plurality of signal lines, which are directly coupled to a plurality of bump pads, to a preset voltage level in a level determination period, and adjusting the preset voltage level in a predetermined order when the level determination period is repeated; a signal input circuit suitable for receiving voltage levels that are inputted through the signal lines and determining logic values for the inputted voltage levels of the signal lines; and an operation unit suitable for receiving the voltage levels of the signal lines from the signal input circuit in a parallel manner in the level determination period, latching the logic values of the voltage levels, and serially outputting the logic values through a probe pad.

In an embodiment, an operation method of a semiconductor device, may include: (a) driving a plurality of signal lines, which are directly coupled to a plurality of bump pads, to a preset voltage level, receiving voltage levels of the signal lines through a signal input circuit in a parallel manner, and latching logic values of the voltage levels; (b) serially outputting the logic values latched in the parallel manner in the latching through a probe pad; and (c) alternately performing the step (a) and the step (b) by a preset number of times, while adjusting the preset voltage level in a predetermined order when the step (a) is repeated.

In an embodiment, an operation method of a semiconductor device having a signal input circuit and a boundary scan test path, may include: performing a boundary scan test by using the boundary scan test path, which includes a scan input probe pad and a scan output probe pad; and performing a DC characteristics test for the signal input circuit, which receives input signals through a plurality of bump pads, wherein the signal input circuit is selectively coupled to the boundary scan test path while the DC characteristics test is performed.

According to the embodiments of the present invention, even in a semiconductor device that inputs/outputs a signal by using a bump pad, it may be possible to test a state of a signal input circuit, which is electrically coupled to the bump pad, with a variable voltage level generated internally by using a boundary scan test (BST) path.

Consequently, even when direct input/output of a signal is not performed through the bump pad, the state of the signal input circuit electrically coupled to the bump pad may be tested.

DETAILED DESCRIPTION

Figure 1:
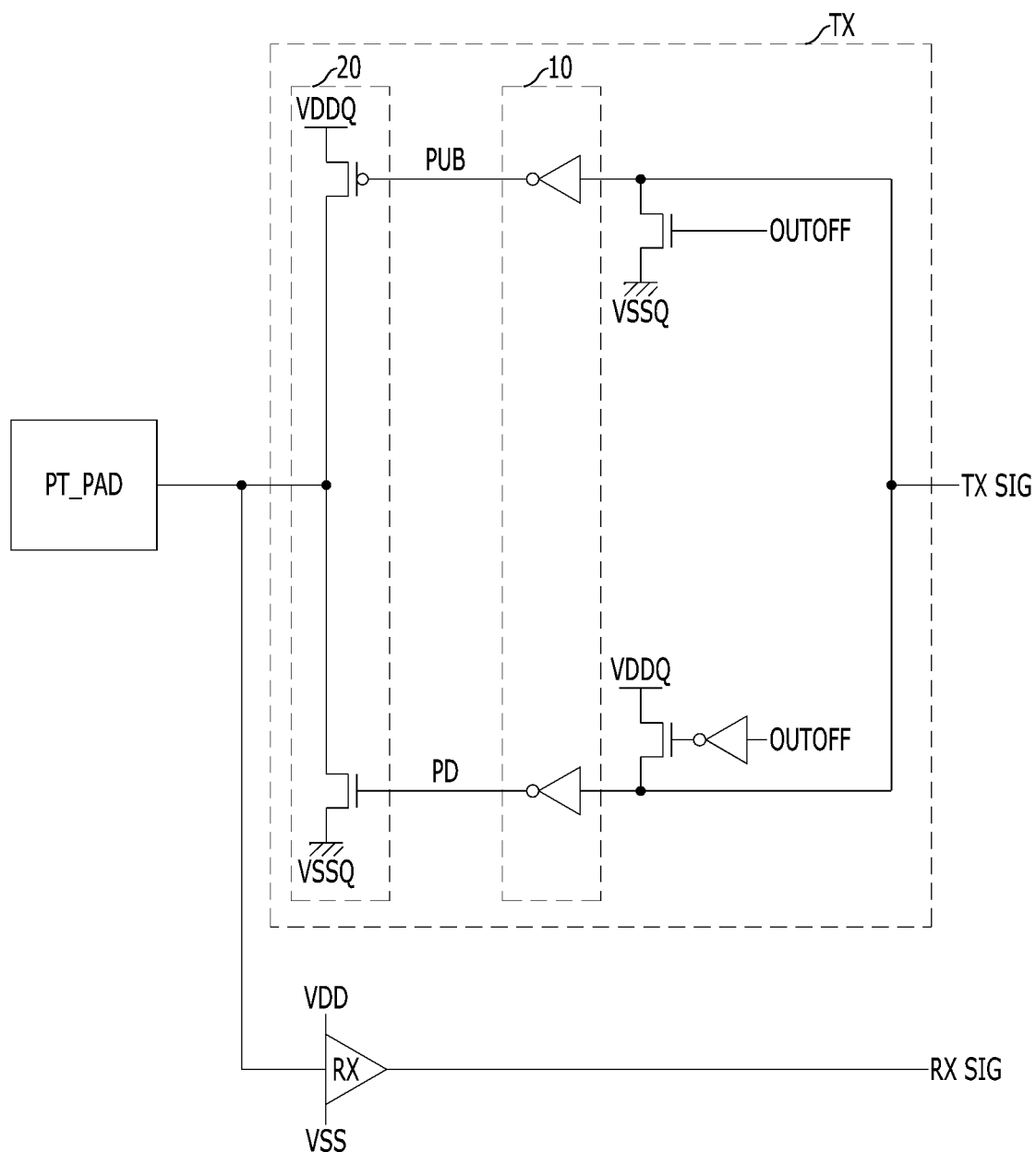
FIG. 1 is a diagram illustrating a signal input/output circuit of a conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In this specification, specific terms have been used. The terms are used to describe the present invention and are not used to qualify the sense or limit the scope of the present invention. It is also noted that in this specification, 'and/or' represents that one or more components arranged before and after 'and/or' may be included. Furthermore, "connected/coupled" refers to one component not only directly coupling another component but also indirectly coupling another component through an intermediate component. In addition, a singular form may include the plural form, and vice versa, as long as it is not specifically mentioned. Furthermore, 'include/comprise' or 'including/comprising' used in the specification represents that one or more components, steps, operations, and elements exists or are added.

FIG. 1 is a diagram illustrating a signal input/output circuit of a conventional semiconductor device.

Referring to FIG. 1, it is noted that a signal input circuit RX and a signal output circuit TX correspond to a single pad PT_PAD as a group. That is, since the pad PT_PAD may receive a signal or output a signal, the signal input circuit RX and the signal output circuit TX are to be assigned to the pad PT_PAD.

The signal output circuit TX includes a pre-driver 10 and a main driver 20.

When a signal TX_SIG is outputted in response to a read command (not illustrated), the pre-driver 10 inverts the signal TX_SIG and generates output control signals PUB and PD. The pre-driver 10 disables all the output control signals PUB and PD in response to a signal OUTOFF indicating a period in which no read operation is generated.

The main driver 20 pull-up drives the pad PT_PAD to a power supply voltage VDDQ or pull-down drives the pad PT_PAD to a ground voltage VSSQ in response to the output control signals PUB and PD. When the output control signals PUB and PD are disabled, the main driver 20 is also disabled not to drive the preset pad PT_PAD.

The signal input circuit RX converts a voltage level of a signal RX_SIG applied through the pad PT_PAD into a logic level. That is, when the signal RX_SIG applied through the pad PT_PAD has a voltage level lower than a low sensing voltage level VIL, the signal input circuit RX drives the signal RX_SIG to the ground voltage VSSQ corresponding to logic 'low'. However, when the signal RX_SIG applied through the pad PT_PAD has a voltage level higher than a high sensing voltage level VIH, the signal input circuit RX drives the signal RX_SIG to the power supply voltage VDDQ corresponding to logic 'high'.

It is in this way that the logic level of the signal RX_SIG applied from an exterior of the semiconductor device is determined based on a high sensing voltage level VIH and a low sensing voltage level VIL employed by the signal input circuit RX as references.

Figure 2:
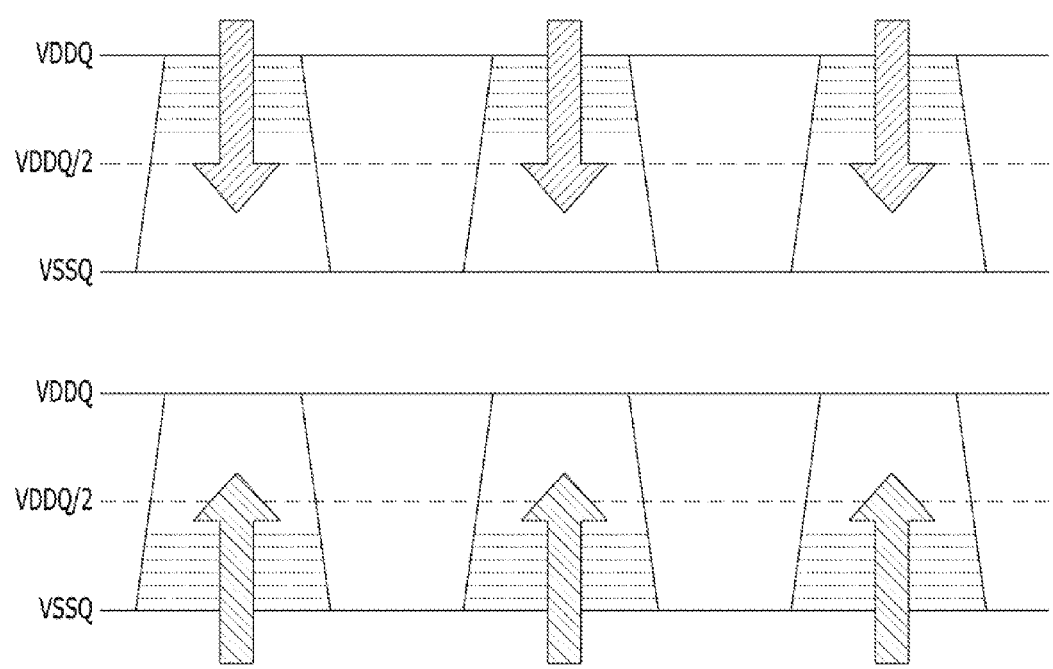
FIG. 2 is a diagram for describing a scheme of testing a low sensing voltage level VIL and a high sensing voltage level VIH in a signal input circuit of a semiconductor device.

FIG. 2 is a diagram for describing a scheme of testing the low sensing voltage level VIL and the high sensing voltage level VIH in the signal input circuit of the semiconductor device. Such a test may be referred to as a DC characteristics test for a signal input circuit.

Referring to FIG. 2, a test method for measuring the high sensing voltage level VIH employed by the signal input circuit RX is designed to decrease the voltage level of the signal RX_SIG applied to the signal input circuit RX from a power supply voltage VDDQ level at a predetermined interval and to measure a logic level of the signal RX_SIG. For example, a logic level, which is measured in the process of decreasing the voltage level of the signal RX_SIG applied to the signal input circuit RX from the power supply voltage VDDQ level at the predetermined interval, is changed (or adjusted) from logic high' to logic 'low', and at this time point, the voltage level of the signal RX_SIG applied to the signal input circuit RX is directly the high sensing voltage level VIH.

Similarly, a test method for measuring the low sensing voltage level VIL employed by the signal input circuit RX is designed to increase the voltage level of the signal RX_SIG applied to the signal input circuit RX from a ground voltage VSSQ level at a predetermined interval and to measure a logic level of the signal RX_SIG. For example, a logic level, which is measured in the process of increasing the voltage level of the signal RX_SIG applied to the signal input circuit RX from the ground voltage VSSQ level at the predetermined interval, is changed from logic 'low' to logic 'high', and at this time point, the voltage level of the signal RX_SIG applied to the signal input circuit RX is directly the low sensing voltage level VIL.

In the aforementioned semiconductor device illustrated in FIGS. 1 and 2, the pad PT_PAD allows direct probing from an exterior. That is, with a sufficient size, the pad PT_PAD may be detected by a probe for a test to input/output a signal.

However, recent semiconductor devices may input/output a signal by using a bump pad, and thus the direct probing may not be possible. That is, the bump pad may not be directly detected by a probe for a test.

Figure 3:
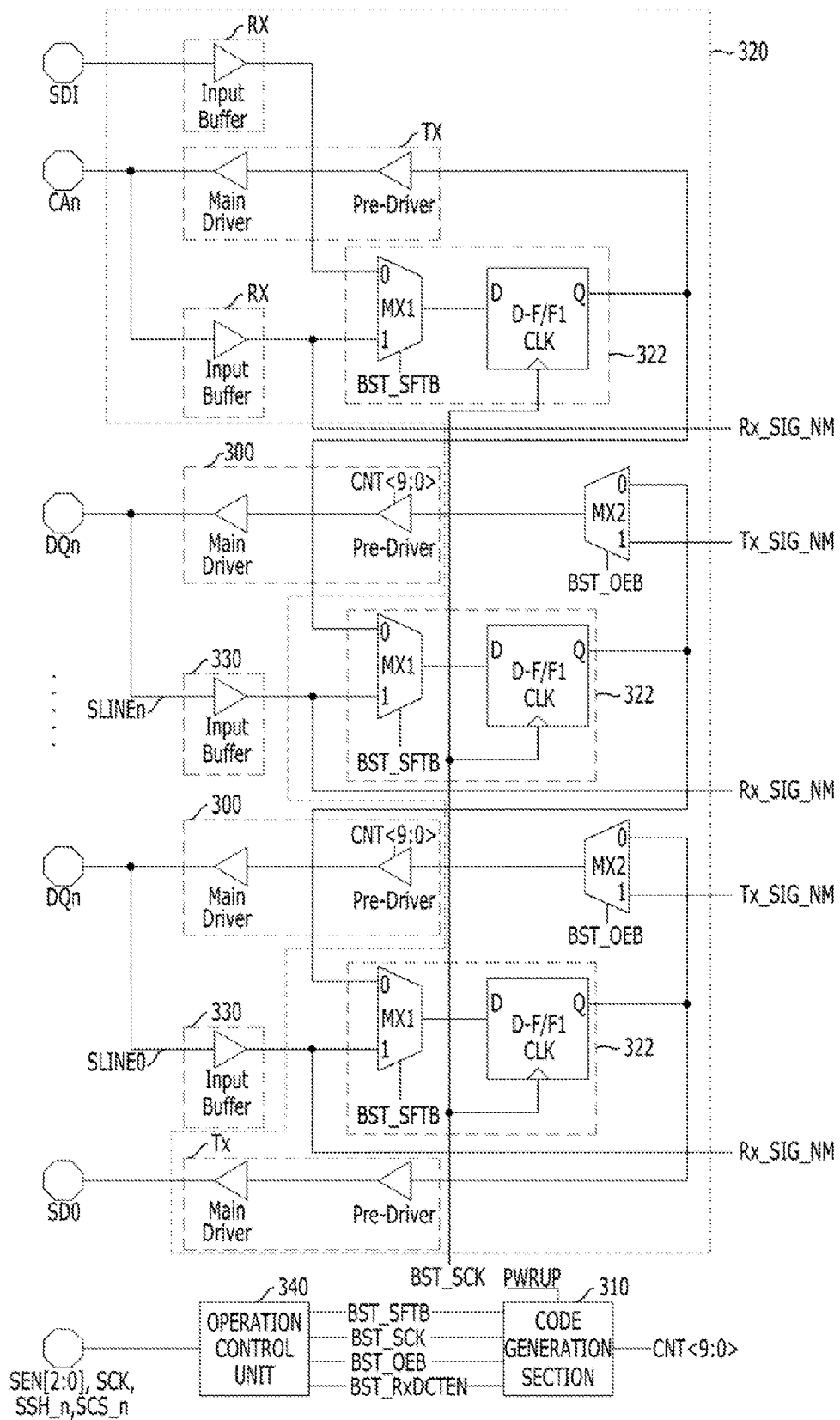
FIG. 3 is a diagram illustrating a semiconductor device in accordance with an embodiment of the present invention.

FIG. 3 is a diagram illustrating the semiconductor device in accordance with an embodiment of the present invention. FIG. 3 illustrates a circuit that tests the low sensing voltage level VIL and the high sensing voltage level VIH with respect to the signal input circuit electrically coupled to the bump pad in the semiconductor device.

Referring to FIG. 3, the semiconductor device may include a plurality of bump pads DQ0 to DQn, a plurality of probe pads SDI, SDO, CAn, SEN[2:0], SCK, SSH_n, and SCS_n, a driving unit, a signal input circuit 330, an operation unit 320, and an operation control unit 340. The driving unit may include a driving operation section 300 and a code generation section 310. The operation unit 320 may include a plurality of signal storage sections 322, a plurality of path selection sections MX2, a plurality of signal input buffers RX, and a plurality of signal output buffers TX, which may form a boundary scan test path. Each of the signal storage sections 322 may include a connection selection part MX1 and a delay flip-flop D-F/F1.

The bump pads DQ0 to DQn represent pads that may not be detected by direct probing at a wafer level. That is, only after the semiconductor device is packaged, a signal is inputted/outputted through the bump pads DQ0 to DQn, for example, data input/output pads.

The probe pads SDI, SDO, CAn, SEN[2:0], SCK, SSH_n, and SCS_n indicate pads that allow the direct probing at a wafer level. Particularly, the probe pads SDI, SDO, CAn, SEN[2:0], SCK, SSH_n, and SCS_n Illustrated in FIG. 3 serve as paths through which signals required for controlling the operation of the semiconductor device are inputted/outputted. In brief, among the probe pads SDI, SDO, CAn, SEN[2:0], SCK, SSH_n, and SCS_n, the SDI is a scan input probe pad for receiving signals in a serial manner in a boundary scan test operation. The SDO is a scan output probe pad for outputting signals in a serial manner in the boundary scan test operation or an operation of a level determination period. The CAn represents N pads for receiving/outputting signals, such as an address signal or a command signal, which are used for controlling a general operation of the semiconductor device. The SEN[2:0] is a pad for receiving signals for deciding enable or disable of the boundary scan test operation, enable or disable of a normal operation, and entrance or escape of the level determination period. The SCK is a pad for receiving an operation clock of the boundary scan test operation or the level determination period. The SSH_n is a pad for receiving a signal for deciding various modes of the boundary scan test operation and the operation of the level determination period. The SCS_n is a pad for receiving a signal for selecting two or more semiconductor devices when the two or more semiconductor devices are stacked.

Among the signals inputted through the probe pads SDI, SDO, CAn, SEN[2:0], SCK, SSH_n, and SCS_n, signals directly related to the operation of the level determination period in accordance with the embodiment of the present invention will be described together with the operation of the operation control unit 340.

The operation control unit 340 generates a signal BST_OEB for selecting whether to perform a normal operation in response to the signal applied through the pad SEN[2:0] among the probe pads SDI, SDO, CAn, SEN[2:0], SCK, SSH_n, and SCS_n. The operation control unit 340 generates a signal BST_RxDCTEN for selecting whether to perform the operation of the level determination period in response to the signal applied through the pad SEN[2:0]. The operation control unit 340 generates a signal (not illustrated) for selecting whether to perform the boundary scan test operation in response to the signal applied through the pad SEN[2:0]. The operation control unit 340 generates a signal BST_SFTB for selecting whether to perform an operation of a parallel input period or an operation of a serial input period in response to the signal applied through the pad SSH_n. The operation control unit 340 generates an operation clock BST_SCK in response to the signal applied through the pad SCK.

With a configuration for performing the operation of the level determination period, the signal BST_RxDCTEN for determining whether to perform the operation of the level determination period keeps an activated state in the level determination period, and the signal BST_OEB for determining whether to perform the operation of a normal operation period keeps a deactivated state in the level determination period.

The operation of the level determination period may include the operation of the parallel input period and the operation of the serial input period. Accordingly, when the signal BST_RxDCTEN for determining whether to perform the operation of the level determination period is activated, the value of the signal BST_SFTB for selecting one of the operation of the parallel input period and the operation of the serial input period is selectively changed. For example, the signal BST_SFTB for selecting one of the operation of the parallel input period and the operation of the serial input period is changed to keep a logic 'low' state in the operation of the parallel input period and to keep a logic 'high' state in the operation of the serial input period.

The driving unit drives a plurality of signal lines SLINE0 to SLINEn, which are directly coupled to the bump pads DQ0 to DQn, to a preset voltage level in the level determination period, and changes (or adjusts) the preset voltage level in a predetermined order whenever the level determination period is repeated. The driving unit drives the signal lines SLINE0 to SLINEn, which are directly coupled to the bump pads DQ0 to DQn, to logic 'high' or logic 'low' in response to a signal TX_SIG_NM outputted from an internal circuit (not illustrated) in the normal operation period.

The code generation section 310 of the driving unit changes (or adjusts) and generates a value of a driving control code CNT<9:0> in a predetermined order whenever the level determination period is repeated. In the normal operation period, the code generation section 310 fixes the value of the driving control code CNT<9:0> to a preset value for generation.

In detail, the code generation section 310 may operate to set the driving control code CNT<9:0> to a minimum value at the time of power-up, and to increase the value of the driving control code CNT<9:0> at a preset interval whenever the level determination period is repeated until the driving control code CNT<9:0> reaches a maximum value after the power-up. Furthermore, the code generation section 310 may operate to set the driving control code CNT<9:0> to the maximum value at the time of the power-up, and to decrease the value of the driving control code CNT<9:0> at a preset interval whenever the level determination period is repeated until the driving control code CNT<9:0> reaches the minimum value after the power-up.

That is, in the case of measuring the low sensing voltage level VIL of the signal input circuit 330 in the level determination period, the operation of the code generation section 310 is controlled such that the driving control code CNT<9:0> is changed from the minimum value to the maximum value. Furthermore, in the case of measuring the high sensing voltage level VIH of the signal input circuit 330 in the level determination period, the operation of the code generation section 310 is controlled such that the driving control code CNT<9:0> is changed from the maximum value to the minimum value. Of course, in the case of measuring all the low sensing voltage levels VIL and the high sensing voltages level VIH of the signal input circuit 330 in the level determination period, the operation of the code generation section 310 is controlled such that the driving control code CNT<9:0> is changed from the minimum value to the maximum value and then changed from the maximum value to the minimum value.

As described above, if the driving control code CNT<9:0> is changed (or adjusted) whenever the level determination period is repeated, the value may be decreased or increased in one direction. However, this is for illustrative purposes only, and the scheme, in which the driving control code CNT<9:0> is changed whenever the level determination period is repeated, does not limit the scope of the present invention. For example, the scheme, in which the driving control code CNT<9:0> is changed whenever the level determination period is repeated, may include a scheme of repeatedly changing (or adjusting) a specific value section, a scheme of repeatedly generating an increase and a decrease, and the like.

The driving operation section 300 of the driving unit drives each of the signal lines SLINE0 to SLINEn with driving strength corresponding to the driving control code CNT<9:0> in the level determination period. At this time, since the value of the driving control code CNT<9:0> is changed whenever the level determination period is repeated, the driving operation section 300 also drives each of the signal lines SLINE0 to SLINEn with driving strength changed whenever the level determination period is repeated. Accordingly, voltage levels of the signal lines SLINE0 to SLINEn are changed whenever the level determination period is repeated.

The code generation section 310 fixes the value of the driving control code CNT<9:0> to a preset value in the operation of the normal operation period, so that the driving operation section 300 may drive the signal lines SLINE0 to SLINEn to logic 'high' of the power supply voltage VDDQ level or logic 'low' of the ground voltage VSSQ level in response to a signal TX_SIG_NM outputted from an internal circuit (not illustrated).

The signal input circuit 330 receives the voltage levels of the signal lines SLINE0 to SLINEn and converts the received voltage levels into logic levels. That is, the signal input circuit 330 determines (or senses) logic values for the voltage levels of the signal lines SLINE0 to SLINEn based on a high sensing voltage level VIH and a low sensing voltage level VIL of the signal input circuit 330, which may be determined by various factors in the process of producing the semiconductor device. At this time, since the voltage levels of the signal lines SLINE0 to SLINEn are changed due to the operation of the driving unit whenever the level determination period is repeated, the logic values of the signal lines SLINE0 to SLINEn, which are inputted to the signal input circuit 330 while the level determination period is being repeated, are also changed.

The operation unit 320 receives the voltage levels of the signal lines SLINE0 to SLINEn through the signal input circuit 330 in a parallel manner in the level determination period, latches the logic values of the signal lines SLINE0 to SLINEn, and outputs the logic values through the pad SDO in a serial manner. At this time, the operation unit 320 is controlled by the signals BST_SFTB, BST_SCK, BST_OEB, and BST_RxDCTEN outputted from the operation control unit 340, so that the operation of the level determination period, the operation of the parallel input period, and the operation of a serial output period are performed. That is, the operation control unit 340 controls the operation of the operation unit 320 through a scheme of appropriately setting the activation or deactivation of the outputted signals BST_SFTB, BST_SCK, BST_OEB, and BST_RxDCTEN. In detail, when the operation of the level determination period is performed, the signal BST_RxDCTEN, which is outputted from the operation control unit 340 and determines whether to perform the operation of the level determination period, keeps an activated state, and the signal BST_OEB, which is outputted from the operation control unit 340 and determines whether to perform the operation of the normal operation period, keeps a deactivated state, and the signal BST_SFTB, which selects one of the operation of the parallel input period and the operation of the serial input period, is alternately changed between a logic 'low' state and a logic 'high' state.

The signal storage sections 322 included in the operation unit 320 are electrically coupled to an output terminal of the signal input circuit 330 in a parallel manner in the parallel input period of the level determination period, and latch the logic values of the signal lines SLINE0 to SLINEn. The signal storage sections 322 are serially coupled to one another in the serial output period of the level determination period, and the signal storage sections 322 output the logic values latched therein through the pad SDO.

The connection selection part MX1 included in each of the signal storage sections 322 electrically couples an input terminal of a corresponding signal storage section 322 to the signal input circuit 330 in the parallel input period of the level determination period. Consequently, in the parallel input period, a logic value inputted through the signal input circuit 330 may be stored in the corresponding signal storage section 322. In the serial output period of the level determination period, the connection selection part MX1 electrically couples an output terminal of a previous signal storage section 322 to an input terminal of the corresponding signal storage section 322. Consequently, in the serial output period, a logic value stored in the previous signal storage section 322 may be moved to and stored in the corresponding signal storage section 322.

The delay flip-flop D-F/F1 included in each of the signal storage sections 322 receives an output signal of the connection selection part MX1 at each preset edge of the operation clock BST_SCK, and outputs the output signal.

In detail, in the parallel input period, based on the toggling of the operation clock BST_SCK, the logic value inputted through the signal input circuit 330 is delayed through the delay flip-flop D-F/F1 for output. At this time, since the operation clock BST_SCK is controlled to be toggled only once in the parallel input period, the logic value inputted through the signal input circuit 330 is just like a value stored in the delay flip-flop D-F/F1 in the parallel input period.

In the serial output period, based on the toggling of the operation clock BST_SCK, a logic value outputted from a previous delay flip-flop D-F/F1 is delayed through a corresponding delay flip-flop D-F/F1 for output. At this time, since the operation clock BST_SCK is controlled to be toggled by the number of times corresponding to the number of the signal storage sections 322 in the serial output period, logic values stored in all the delay flip-flops D-F/F1 included in the signal storage sections 322 are sequentially outputted through the pad SDO in the operation of the parallel input period in the serial output period.

The signal input buffers RX, included in the operation unit 320, and the signal input circuit 330 look like completely the same circuits. However, since the signal input buffers RX and the signal input circuit 330 are arranged at different positions, the signal input buffers RX and the signal input circuit 330 are different from each other. That is, since the signal input buffers RX may receive signals applied through the probe pads SDI, SDO, and CAn, the high sensing voltage level VIH and the low sensing voltage level VIL of the signals may be measured through probing at a wafer level. However, since the signal input circuit 330 is to receive signals applied through the bump pads DQ0 to DQn, the high sensing voltage level VIH and the low sensing voltage level VIL of the signals may not be measured through probing at a wafer level.

Similarly, the signal output buffers TX, included in the operation unit 320, and the driving operation section 300 look like similar circuits. However, they are different circuits in that the driving control code CNT<9:0> are applied only to the driving operation section 300.

The path selection section MX2 included in the operation unit 320 electrically couples an internal circuit (not illustrated) to the driving operation section 300 in the normal operation period.

Through this, in the normal operation period, the signal TX_SIG_NM outputted from the internal circuit (not illustrated) is driven to the signal lines SLINE0 to SLINEn through the driving unit, and then is outputted through the bump pads DQ0 to DQn. The path selection section MX2 substantially prevents the internal circuit (not illustrated) from being electrically coupled to the driving operation section 300 in the boundary scan test operation or the operation of the level determination period.

The boundary scan test operation is an operation for testing whether the bump pads DQ0 to DQn are normally formed in the packaged semiconductor device. The boundary scan test operation may include an operation for receiving signals through the pad SDI in a serial manner and outputting the signals through the bump pads DQ0 to DQn in a parallel manner. Further, the boundary scan test operation may include an operation for receiving signals through the bump pads DQ0 to DQn in a parallel manner and outputting the signals through the pad SDI in a serial manner. The operation of the level determination period is partially similar to the boundary scan test operation in that logic values of an internal driving voltage are received in a parallel manner and are outputted through the pad SDO in a serial manner. However, the operation of the level determination period according to the embodiment of the present invention may be substantially different from the boundary scan test operation in that no signals are directly inputted/outputted through the bump pads DQ0 to DQn.

Figure 4:
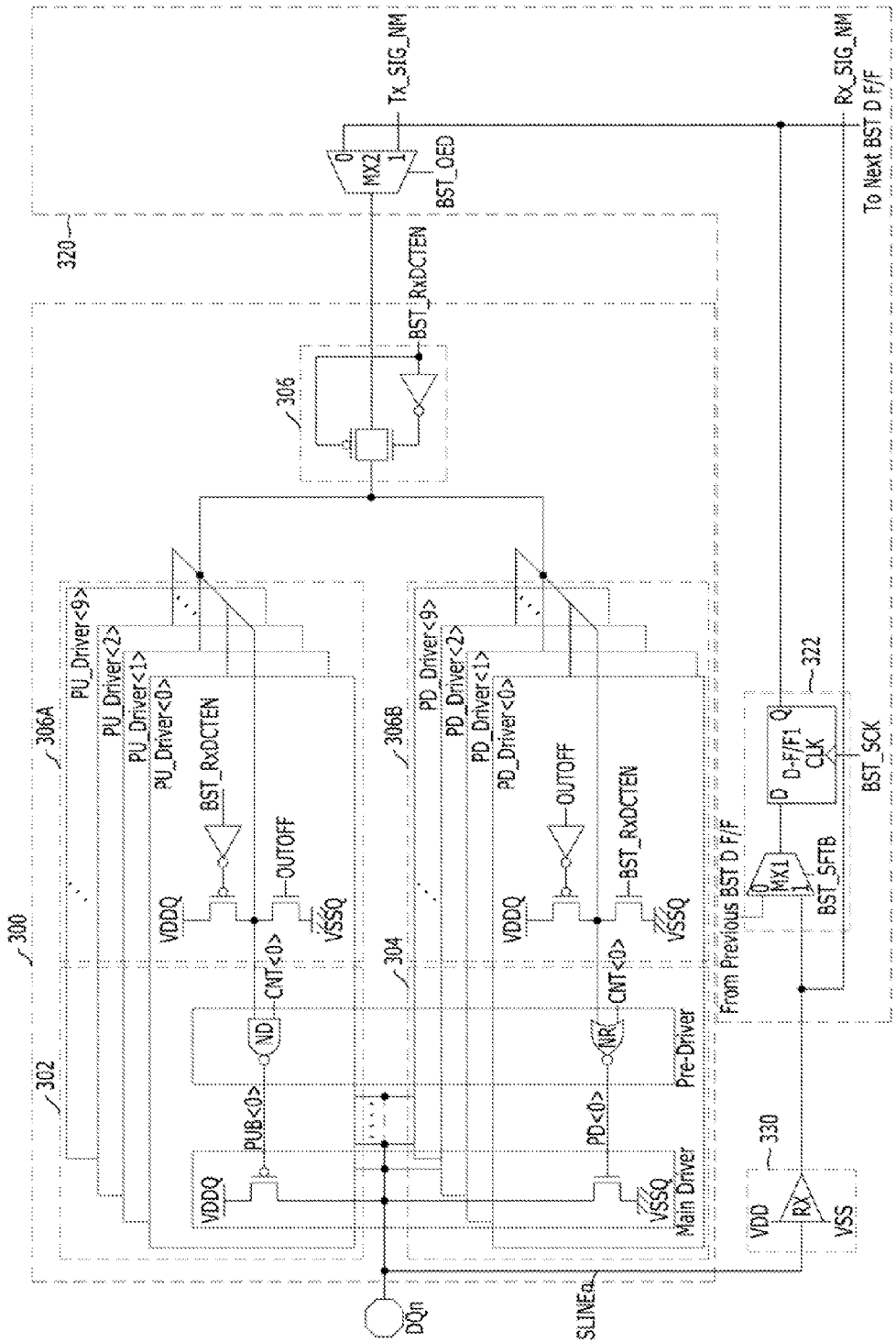
FIG. 4 is a detailed diagram of a driving operation section illustrated in FIG. 3.

FIG. 4 is a detailed diagram of the driving operation section 300 illustrated in FIG. 3.

Referring to FIG. 4, the driving operation section 300 may include a first driving operation part 302 and a second driving operation part 304. The driving operation section 300 may further include a level determination period operation parts 306A and 306B.

The first driving operation part 302 drives each of the signal lines SLINE0 to SLINEn to a first voltage level with driving strength proportional to the number of '0s' of the driving control code CNT<9:0> and inversely proportional to the number of '1s' of the driving control code CNT<9:0> in the level determination period. The first driving operation part 302 and the level determination period operation part 306A may form a plurality of pull-up drivers PU_Driver<9:0>.

The second driving operation part 304 drives each of the signal lines SLINE0 to SLINEn to a second voltage level with driving strength proportional to the number of '1s' of the driving control code CNT<9:0> and inversely proportional to the number of '0s' of the driving control code CNT<9:0> in the level determination period. The second driving operation part 304 and the level determination period operation part 306B may form a plurality of pull-down drivers PD_Driver<9:0>.

As Illustrated in FIG. 4, when the first voltage level is the power supply voltage VDDQ level, the second voltage level is the ground voltage VSSQ level. In this case, the first driving operation part 302 performs a pull-up driving operation to the power supply voltage VDDQ level, and the second driving operation part 304 performs a pull-down driving operation to the ground voltage VSSQ level.

On the contrary, when the first voltage level is the ground voltage VSSQ level, the second voltage level is the power supply voltage VDDQ level. In this case, the first driving operation part 302 performs a pull-down driving operation to the ground voltage VSSQ level, and the second driving operation part 304 performs a pull-up driving operation to the power supply voltage VDDQ level.

In this way, the first driving operation part 302 and the second driving operation part 304 simultaneously perform driving operations opposite to each other based on the signal lines SLINE0 to SLINEn. When the value of '0' increases in the driving control code CNT<9:0>, since the value of '1' decreases, the driving strength of the second driving operation part 304 decreases when the driving strength of the first driving operation part 302 increases. However, when the value of '0' decreases in the driving control code CNT<9:0>, since the value of '1' increases, the driving strength of the second driving operation part 304 increases when the driving strength of the first driving operation part 302 decreases. Consequently, the signal lines SLINE0 to SLINEn have a specific voltage level between the power supply voltage VDDQ level and the ground voltage VSSQ level according to the value of the driving control code CNT<9:0>.

The level determination period operation parts 306A and 306B fixes the input terminal of the driving operation section 300 to a preset voltage level in the level determination period. Through this, in the level determination period, the driving operation section 300 is completely separated from the other elements and may drive each of the signal lines SLINE0 to SLINEn with driving strength corresponding to only the driving control code CNT<9:0>.

That is, as illustrated in FIG. 4, when the first driving operation part 302 performs the pull-up operation to the power supply voltage VDDQ level, the level determination period operation part 306A fixes the input terminal (i.e., one input terminal of a NAND gate ND) of the first driving operation part 302, which is an input path of the signal TX_SIG_NM of the internal circuit (not illustrated), to the power supply voltage VDDQ level, so that the driving control code CNT<9:0> applied to the other input terminal of the NAND gate ND included in the first driving operation part 302 operate to determine pull-up driving strength of the first driving operation part 302.

Similarly, as illustrated in FIG. 4, when the second driving operation part 304 performs the pull-down operation to the ground voltage VSSQ level, the level determination period operation part 306B fixes the input terminal (i.e., one input terminal of a NOR gate NR) of the second driving operation part 304, which is the input path of the signal TX_SIG_NM of the internal circuit (not illustrated), to the ground voltage VSSQ level, so that the driving control code CNT<9:0> applied to the other input terminal of the NOR gate NR included in the second driving operation part 304 operate to determine pull-down driving strength of the second driving operation part 304.

Figure 5:
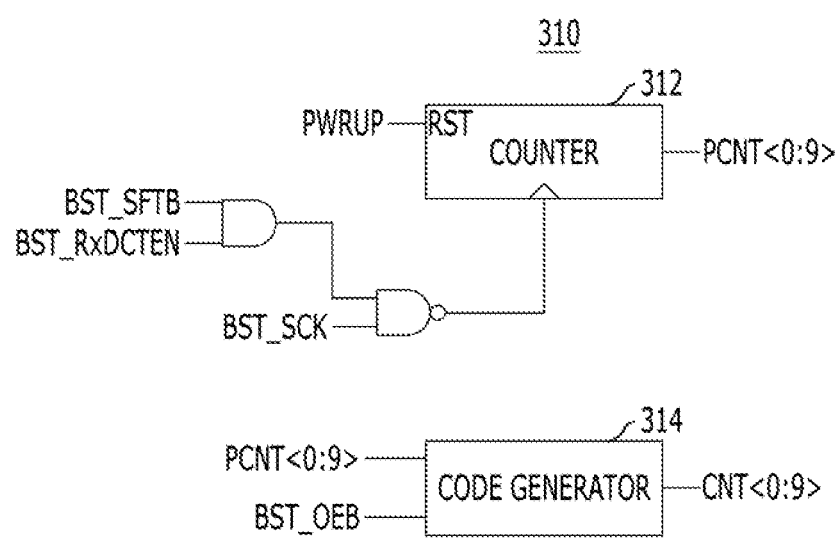
FIG. 5 is a detailed diagram of a code generation section illustrated in FIG. 3.

FIG. 5 is a detailed diagram of the code generation section 310 illustrated in FIG. 3.

Referring to FIG. 5, the code generation section 310 may include a counter 312 and a code generator 314.

The code generation section 310 sets the driving control code CNT<9:0> to an initial value in response to the toggling of a power-up signal PWRUP. In the case of performing the operation of the parallel input period in the state of entering the level determination period after the initialization in response to the power-up signal PWRUP, the code generation section 310 changes the driving control code CNT<9:0> in a preset order in response to the toggling of the operation clock BST_SCK. At this time, in the operation of the parallel input period performed in the state of entering the level determination period, since the voltage levels of the signal lines SLINE0 to SLINEn are simultaneously inputted through the signal input circuit 330 and the logic values of the signal lines SLINE0 to SLINEn are determined in a parallel manner, the toggling of the operation clock BST_SCK corresponding to the parallel input period is generated only once. Accordingly, whenever the operation of the level determination period is performed once, the value of the driving control code CNT<9:0> is changed only once. For example, when it is assumed that the operation of the level determination period is repeatedly performed ten times, the value of the driving control code CNT<9:0> is also changed ten times, gradually.

In the case of performing the operation of the serial output period in the state of entering the level determination period, the code generation section 310 does not change the driving control code CNT<9:0> regardless of the toggling of the operation clock BST_SCK. That is, the value of the driving control code CNT<9:0> changed in the parallel Input period before the serial output period is substantially kept.

The code generation section 310 fixes the driving control code CNT<9:0> to a preset value in the normal operation period other than the level determination period.

The counter 312 initializes a value of a pre-driving control code PCNT<9:0> in response to the toggling of the power-up signal PWRUP. When the signal BST_RxDCTEN for deciding whether to enter the level determination period is activated, in the case of performing the operation of the parallel input period in response to logic 'high' of the signal BST_SFTB for selecting the parallel input period and the serial output period after entering the level determination period, the counter 312 changes (or adjusts) the value of the pre-driving control code PCNT<9:0> at a falling edge of the operation clock BST_SCK. At this time, when the initial value of the pre-driving control code PCNT<9:0> is a maximum value, a counting operation is performed to decrease the value. However, when the initial value of the pre-driving control code PCNT<9:0> is a minimum value, a counting operation is performed to increase the value. Although not directly illustrated in FIG. 5, it may be also possible to directly control the counting operation of the counter 312 through a separate control circuit. That is, an operation for increasing or decreasing the value may be directly controlled regardless of the value of the pre-driving control code PCNT<9:0>, and an operation for repeatedly increasing or decreasing a specific value section may be directly controlled.

The code generator 314 outputs the value of the pre-driving control code PCNT<9:0> as the value of the driving control code CNT<9:0> as is when the signal BST_OEB for determining whether to perform the operation of the normal operation period is deactivated and the normal operation is not performed. However, when the signal BST_OEB for determining whether to perform the operation of the normal operation period is activated and the normal operation is performed, the code generator 314 fixes the value of the driving control code CNT<9:0> to a preset value for output regardless of the value of the pre-driving control code PCNT<9:0>.

Figure 6:
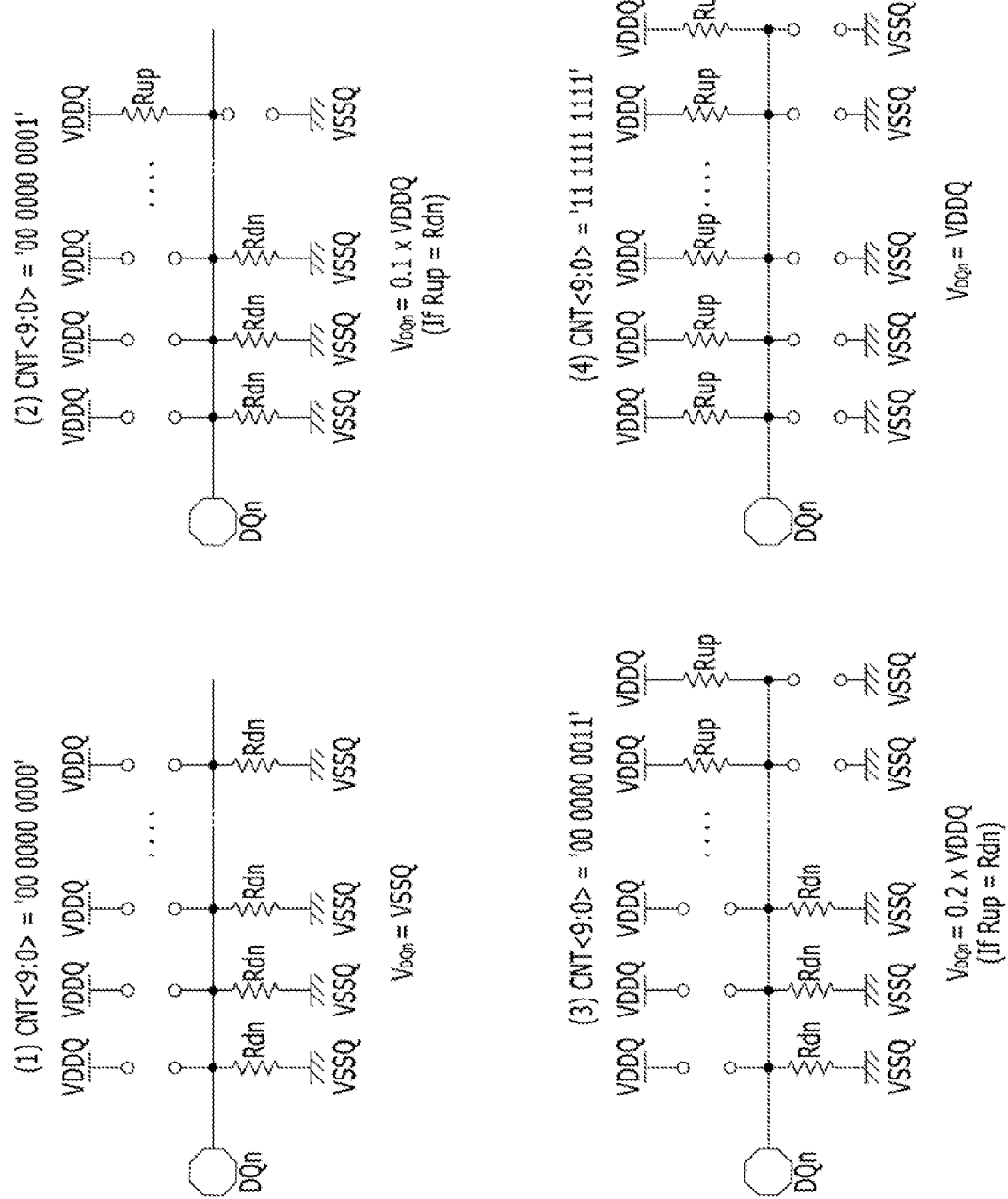
FIGS. 6 and 7 are diagrams for describing an operation of a driving operation section illustrated in FIGS. 3 and 4.
Figure 7:
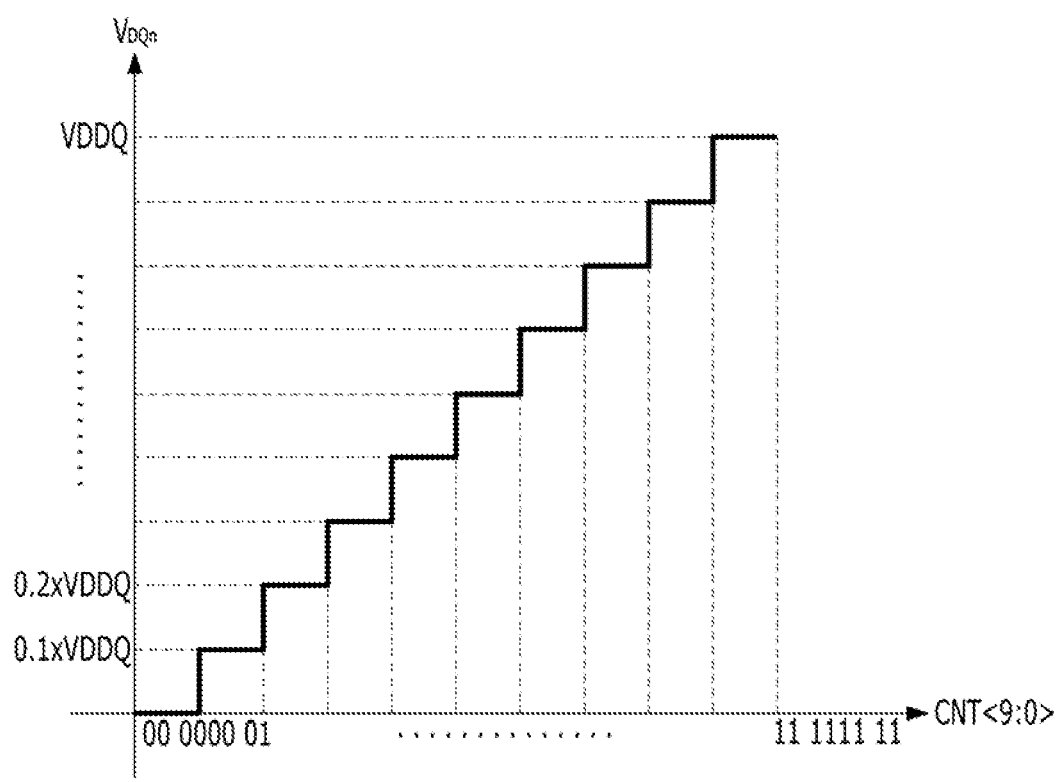

FIGS. 6 and 7 are diagrams for describing an operation of the driving operation section 300 illustrated in FIGS. 3 and 4.

Referring to FIGS. 6 and 7, it is noted that the driving operation section 300 pull-up drives the signal lines SLINE0 to SLINEn to the power supply voltage VDDQ level with driving strength proportional to the number of '0s' of the driving control code CNT<9:0> and inversely proportional to the number of '1s' of the driving control code CNT<9:0>. Furthermore, it is noted that the driving operation section 300 pull-down drives the signal lines SLINE0 to SLINEn to the ground voltage VSSQ level with driving strength proportional to the number of '1s' of the driving control code CNT<9:0> and inversely proportional to the number of '0s' of the driving control code CNT<9:0>.

At this time, the operation for pull-up driving the signal lines SLINE0 to SLINEn to the power supply voltage VDDQ and pull-down driving the signal lines SLINE0 to SLINEn to the ground voltage VSSQ are simultaneously performed. When the number of '0s' of the driving control code CNT<9:0> increases, the number of '1s' decreases, and when the number of '1s' of the driving control code CNT<9:0> increases, the number of '0s' decreases.

Accordingly, it is noted that the voltage level of each of the signal lines SLINE0 to SLINEn is changed between the power supply voltage VDDQ level and the ground voltage VSSQ level gradually according to the value of the driving control code CNT<9:0>.

That is, as illustrated in FIG. 6, when the driving control code CNT<9:0> is a code having 10 bits, it is noted that the power supply voltage VDDQ level and the ground voltage VSSQ level are divided into 10 steps and are changed according to the value of the driving control code CNT<9:0>.

FIG. 7 illustrates that the voltage level of each of the signal lines SLINE0 to SLINEn is changed gradually based on a predetermined interval. However, this is for illustrative purposes only. That is, a level interval, at which the voltage level of each of the signal lines SLINE0 to SLINEn is changed, may be uniformly and linearly set as illustrated in FIG. 7; however, the level Interval may be non-linear and randomly different from FIG. 7. For example, the voltage level of each of the signal lines SLINE0 to SLINEn may be changed gradually based on a relatively dense interval in a specific voltage level period, or may be changed gradually based on a relatively loose interval in a period other than the specific voltage level period.

Figure 8:
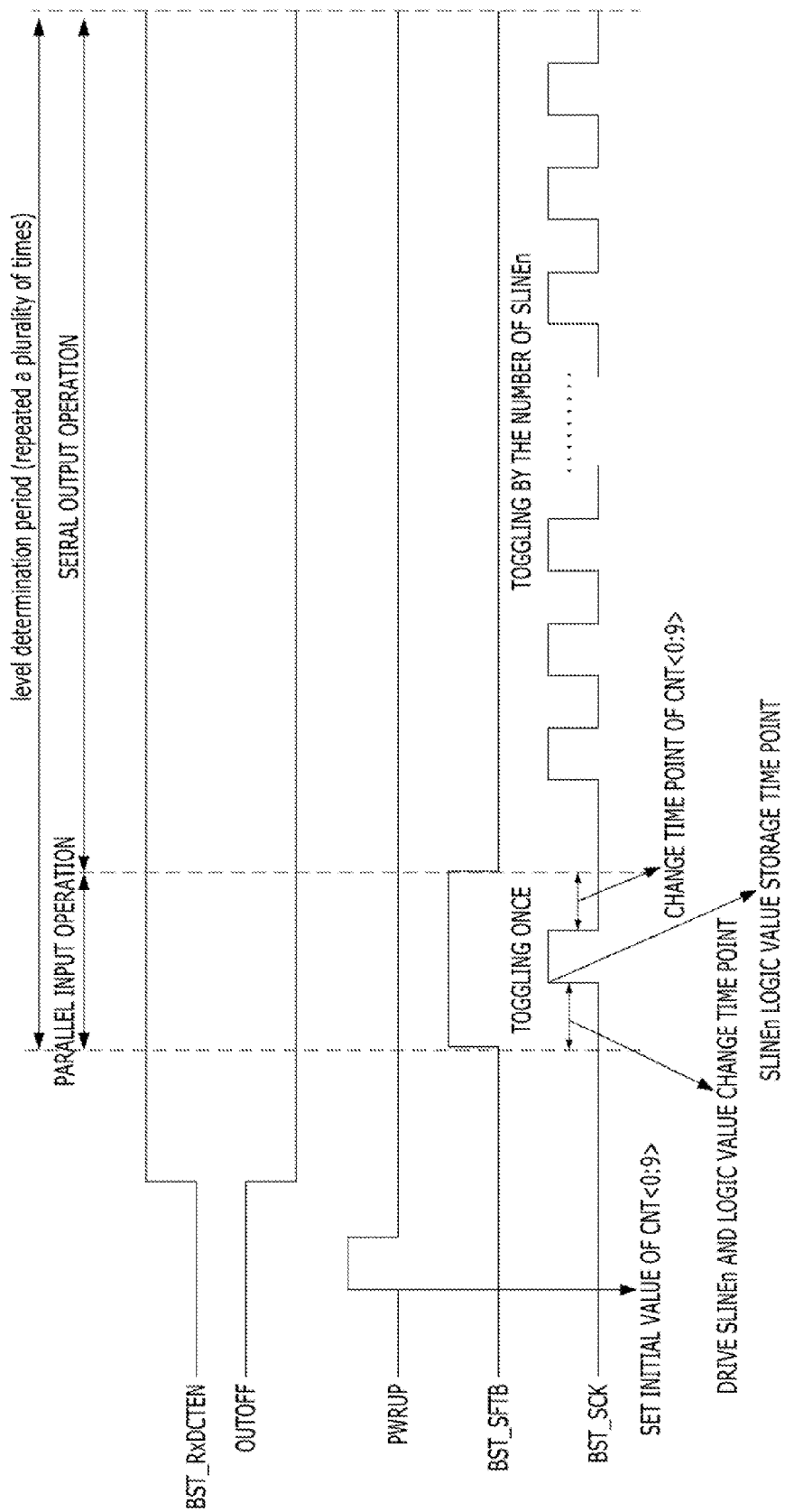
FIG. 8 is a diagram for describing an operation of a semiconductor device illustrated in FIG. 3.

FIG. 8 is a diagram for describing an operation of the semiconductor device illustrated in FIG. 3.

As can be seen from FIG. 8, the circuit, which tests the low sensing voltage level VIL and the high sensing voltage level VIH with respect to the signal input circuit electrically coupled to the bump pad in the semiconductor device in accordance with the embodiment of the present invention, repeatedly performs the operation of the level determination period a plurality of times. For example, the number of repetitions of the level determination period may be decided by a designer based on the number of times by which the driving control code CNT<9:0> may be changed.

In detail, the value of the driving control code CNT<9:0> is set to the initial value in response to the toggling of the power-up signal PWRUP.

Then, when the signal BST_RxDCTEN for determining whether to perform the operation of the level determination period is activated to logic 'high', the operation of the level determination period starts. At this time, in the operation of the level determination period, since no operation for outputting a signal in response to a read command (not illustrated) is performed, a signal OUTOFF indicating a period in which no read operation is performed is also activated to logic 'low' in a period in which the signal BST_RxDCTEN for determining whether to perform the operation of the level determination period is activated to the logic 'high'.

A one-time level determination period is divided into a parallel input period and a serial output period. For example, in the one-time level determination period, a period, in which the signal BST_SFTB for selecting one of the operations of the parallel input period and the operation of the serial input period is activated to logic 'high', is the parallel input period. Furthermore, in the one-time level determination period, a period, in which the signal BST_SFTB for selecting one of the operation of the parallel input period and the operation of the serial input period is deactivated to logic 'low', is the serial output period. Accordingly, the fact that the level determination period is repeated a plurality of times represents that an activated state and a deactivated state of the signal BST_SFTB for selecting one of the operation of the parallel input period and the operation of the serial input period are repeated a plurality of times, respectively.

That is, in the case of entering a first level determination period, when the signal BST_SFTB for selecting one of the operation of the parallel input period and the operation of the serial input period is activated, the operation of the parallel input period is performed, and when the signal BST_SFTB is deactivated, the operation of the serial input period is performed. In the case of entering a second level determination period, when the signal BST_SFTB for selecting one of the operation of the parallel input period and the operation of the serial input period is activated again, the operation of the parallel Input period is performed, and when the signal BST_SFTB is deactivated again, the operation of the serial output period is performed. In this way, when the level determination period is repeated a plurality of times, the activated state and the deactivated state of the signal BST_SFTB for selecting one of the operation of the parallel input period and the operation of the serial input period are repeated a plurality of times, so that the parallel input period and the serial output period are also repeated a plurality of times.

In detail, in the case of entering the parallel input period, the signal lines SLINE0 to SLINEn are driven with driving strength corresponding to the value of the driving control code CNT<9:0>. As a result, the signal lines SLINE0 to SLINEn are driven to a specific voltage level between the power supply voltage VDDQ level and the ground voltage VSSQ level. In this way, the voltage levels of the signal lines SLINE0 to SLINEn driven to the specific voltage level are changed to logic values through the signal input circuit 330. The logic values of the signal lines SLINE0 to SLINEn inputted through the signal input circuit 330 are stored in the signal storage sections 322 at a rising edge of the toggling of the operation clock BST_SCK in a parallel manner. Then, when the value of the driving control code CNT<9:0> is changed at a falling edge of the toggling of the operation clock BST_SCK, the operation of the parallel input period is completed. At this time, the value of the driving control code CNT<9:0> changed at the falling edge of the toggling of the operation clock BST_SCK is used in order to drive the signal lines SLINE0 to SLINEn when entering the parallel input period again.

Then, in the case of entering the serial output period, the signal storage sections 322 are serially coupled to one another. That is, in the parallel input period, the signal storage sections 322 are coupled in parallel to the signal input circuit 330; however, in the serial output period, the signal storage sections 322 are not coupled to the signal input circuit 330. Instead, in the serial output period, the signal storage sections 322 are serially coupled to one another. In this way, the signal storage sections 322 serially coupled to one another sequentially output the logic values of the signal lines SLINE0 to SLINEn, which have been inputted in the previous parallel input period and stored, through the pad SDO whenever the operation clock BST_SCK is toggled. At this time, since the number of the signal storage sections 322 corresponds to the number of the signal lines SLINE0 to SLINEn and all the logic values stored in the signal storage sections 322 are to be serially outputted, the operation clock BST_SCK is toggled by the number of the signal lines SLINE0 to SLINEn. That is, whenever the operation clock BST_SCK is toggled once, since the logic values stored in the signal storage sections 322 are serially moved and are sequentially outputted through the pad SDO, all the logic values stored in the signal storage sections 322 may be sequentially outputted when the operation clock BST_SCK is toggled by the number of the signal lines SLINE0 to SLINEn.

When the aforementioned operation of the serial output period is performed and all the logic values stored in the signal storage sections 322 are outputted to an exterior of the semiconductor device, the operation of the serial output period is completed.

Then, it is determined whether the operation of the parallel input period is performed again or all the operations of the level determination period are completed according to the number of repetitions of the level determination period.

For example, in brief, as illustrated in FIG. 5 and FIG. 6, when the driving control code CNT<9:0> is changed through 10 steps, the level determination period is also repeated 10 times. At this time, in the first level determination period, when the driving control code CNT<9:0> is set to a minimum value, each of the signal lines SLINE0 to SLINEn is driven to the ground voltage VSSQ level. In the second level determination period, since the driving control code CNT<9:0> is increased by $1/10$, each of the signal lines SLINE0 to SLINEn is driven to VDDQ/10 level. In the third level determination period, since the driving control code CNT<9:0> is increased by $2/10$, each of the signal lines SLINE0 to SLINEn is driven to 2*VDDQ/10 level. In this way, in the tenth level determination period, since the driving control code CNT<9:0> has a maximum value, each of the signal lines SLINE0 to SLINEn is driven to the power supply voltage VDDQ level. Consequently, in each process in which the voltage levels of the signal lines SLINE0 to SLINEn are changed through 10 steps from the ground voltage VSSQ level to the power supply voltage VDDQ level, when the logic values of the signal lines SLINE0 to SLINEn are determined through the signal input circuit 330, 10 logic values may be determined for each of the signal lines SLINE0 to SLINEn. Among the 10 logic values determined for each of the signal lines SLINE0 to SLINEn, the voltage level of each of the signal lines SLINE0 to SLINEn, which corresponds to the value of the driving control code CNT<9:0> at the transition time point from logic 'low' to logic 'high', is directly the low sensing voltage level VIL of the signal input circuit 330. At this time, since the signal input circuit 330 independently corresponds to each of the signal lines SLINE0 to SLINEn, the low sensing voltage level VIL of the signal input circuit 330 corresponding to each of the signal lines SLINE0 to SLINEn may be differentially determined.

Similarly, as illustrated in FIG. 5 and FIG. 6, when the driving control code CNT<9:0> is changed through 10 steps, the level determination period is also repeated 10 times. At this time, in the first level determination period, when the driving control code CNT<9:0> is set to a maximum value, each of the signal lines SLINE0 to SLINEn is driven to the power supply voltage VDDQ level. In the second level determination period, since the driving control code CNT<9:0> is decreased by $1/10$, each of the signal lines SLINE0 to SLINEn is driven to 9*VDDQ/10 level. In the third level determination period, since the driving control code CNT<9:0> is decreased by $2/10$, each of the signal lines SLINE0 to SLINEn is driven to 8*VDDQ/10 level. In this way, in the tenth level determination period, since the driving control code CNT<9:0> has a minimum value, each of the signal lines SLINE0 to SLINEn is driven to the ground voltage VSSQ level. Consequently, in each process in which the voltage levels of the signal lines SLINE0 to SLINEn are changed through 10 steps from the power supply voltage VDDQ level to the ground voltage VSSQ level, when the logic values of the signal lines SLINE0 to SLINEn are determined through the signal input circuit 330, 10 logic values may be determined for each of the signal lines SLINE0 to SLINEn. Among the 10 logic values determined for each of the signal lines SLINE0 to SLINEn, the voltage level of each of the signal lines SLINE0 to SLINEn, which corresponds to the value of the driving control code CNT<9:0> at the transition time point from logic 'high' to logic 'low', is directly the high sensing voltage level VIH of the signal input circuit 330. At this time, since the signal input circuit 330 independently corresponds to each of the signal lines SLINE0 to SLINEn, the high sensing voltage level VIH of the signal input circuit 330 corresponding to each of the signal lines SLINE0 to SLINEn may be differentially determined.

When the level determination period is repeated 10 times, logic values for each of the signal lines SLINE0 to SLINEn, which are outputted through the pad SDO in each level determination period, are generated by 10, and are outputted through the pad SDO. That is, the total number of the logic values outputted through the pad SDO becomes 'ten times as much as the number of the signal lines SLINE0 to SLINEn (i.e., (n+1)*10)'. The logic values are stored in a separate storage circuit, which is provided outside of the semiconductor device, by 10 according to the signal lines SLINE0 to SLINEn, and are comprehensively determined, so that a low sensing voltage level VIL value or a high sensing voltage level VIH value for each of the signal lines SLINE0 to SLINEn is determined.

Figure 9:
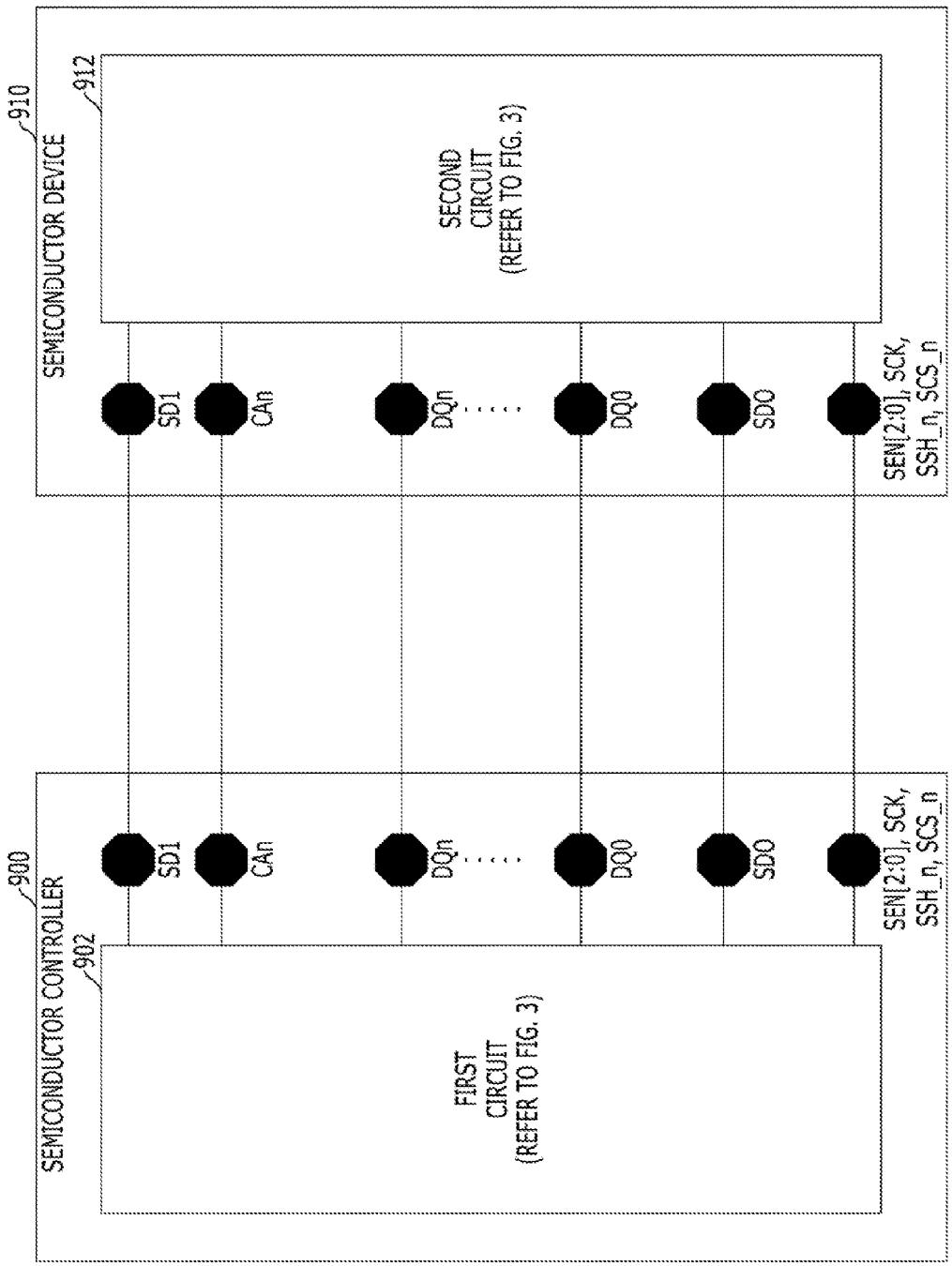
FIG. 9 is a diagram illustrating a semiconductor system in accordance with an embodiment of the present invention.

FIG. 9 is a diagram illustrating a semiconductor system in accordance with the embodiment of the present invention.

Referring to FIG. 9, the semiconductor system may include a semiconductor controller 900 and a semiconductor device 910.

In detail, a first circuit 902 and a second circuit 912, which test the low sensing voltage level VIL and the high sensing voltage level VIH with respect to the signal input circuit electrically coupled to the bump pad in the semiconductor device illustrated in FIG. 3, are included in the semiconductor controller 900 and in the semiconductor device 910, respectively.

Consequently, the semiconductor controller 900 may test the low sensing voltage level VIL and the high sensing voltage level VIH with respect to the signal input circuit electrically coupled to the bump pads DQ0 to DQn included therein through an entrance/escape operation of the level determination period.

Similarly, the semiconductor device 910 may test the low sensing voltage level VIL and the high sensing voltage level VIH with respect to the signal input circuit electrically coupled to the bump pads DQ0 to DQn included therein through the entrance/escape operation of the level determination period.

Furthermore, the semiconductor controller 900 may receive, from the semiconductor device 910, a control signal having a value to be set for the entrance/escape operation of the level determination period, for example, the signal BST_RxDCTEN for selecting whether to perform the operation of the level determination period or not. That is, the level determination period operation of the semiconductor controller 900 may be controlled by the semiconductor device 910 other than an external test device.

Similarly, the semiconductor device 910 may receive, from the semiconductor controller 900, a control signal having a value to be set for the entrance/escape operation of the level determination period, for example, the signal BST_RxDCTEN for selecting whether to perform the operation of the level determination period or not. That is, the level determination period operation of the semiconductor device 910 may be controlled by the semiconductor controller 900 other than an external test device.

When the aforementioned configuration as illustrated in FIG. 9 is applied to a semiconductor system, it may be possible to independently test the level determination period operation of the semiconductor device 910 and the level determination period operation of the semiconductor controller 900 even in a packaged semiconductor system for which direct access of test equipment is limited.

As described above, according to the embodiments of the present invention, even in a semiconductor device that inputs/outputs a signal by using a bump pad, it may be possible to test a state of a signal input circuit, which is electrically coupled to the bump pad, with a variable voltage level generated internally by using a boundary scan test (BST) path.

Consequently, even when direct input/output of a signal is not performed through the bump pad, the state of the signal input circuit electrically coupled to the bump pad may be tested.

Although various embodiments have been described for illustrative purposes, it will be apparent to those skilled in the art that various changes and modifications may be made without departing from the spirit and scope of the invention as defined in the following claims.

For example, the positions and the types of logic gates and transistors employed in the aforementioned embodiments of the present invention may be differently embodied according to activation polarities of the signals to be used.

What is claimed is:
1. A semiconductor device comprising:
   a driving unit suitable for driving a plurality of signal lines, which are directly coupled to a plurality of bump pads, to a preset voltage level in a level determination period, and adjusting the preset voltage level in a predetermined order when the level determination period is repeated;
   a signal input circuit suitable for receiving voltage levels that are inputted through the signal lines and determining logic values for the inputted voltage levels of the signal lines; and
   an operation unit suitable for receiving the voltage levels of the signal lines from the signal input circuit in a parallel manner in the level determination period, latching the logic values of the voltage levels, and serially outputting the logic values through a probe pad,
   wherein the driving unit comprises:
   a code generation section suitable for adjusting a value of a driving control code in the predetermined order when the level determination period is repeated; and
   a driving operation section suitable for driving each of the signal lines with driving strength corresponding to the value of the driving control code in the level determination period,
   wherein, in a normal operation period, a signal outputted from an internal circuit is driven to the signal lines through the driving unit and is outputted to an exterior through the bump pads, and
   a signal applied from an exterior through the bump pads is transferred to the signal lines, a logic value of the signal is determined by the signal input circuit, and the signal is inputted to the internal circuit.

2. The semiconductor device of claim 1, wherein the code generation section sets the driving control code to a minimum value at a time of power-up, and increases the value of the driving control code at a preset interval when the level determination period is repeated, until the driving control code has a maximum value after the power-up.

3. The semiconductor device of claim 1, wherein the code generation section sets the driving control code to a maximum value at a time of power-up, and decreases the value of the driving control code at a preset interval when the level determination period is repeated, until the driving control code has a minimum value after the power-up.

4. The semiconductor device of claim 1, wherein the driving operation section comprises:
   a first driving operation part suitable for driving each of the signal lines to a first voltage level with driving strength proportional to the number of '0s' of the driving control code and inversely proportional to the number of '1s' of the driving control code in the level determination period; and a second driving operation part suitable for driving each of the signal lines to a second voltage level with driving strength proportional to the number of '1s' of the driving control code and inversely proportional to the number of '0s' of the driving control code in the level determination period.

5. The semiconductor device of claim 1, wherein, when the first voltage level is a power supply voltage level, the second voltage level is a ground voltage level, and
wherein, when the first voltage level is the ground voltage level, the second voltage level is the power supply voltage level.

6. The semiconductor device of claim 1, wherein the operation unit comprises:
a plurality of signal storage sections that are electrically coupled to the signal input circuit in a parallel manner and latches the logic values of the signal lines in a parallel input period of the level determination period, and are serially coupled to one another and sequentially output the logic values latched therein through the probe pad in a serial output period of the level determination period.

7. The semiconductor device of claim 6, wherein each of the signal storage sections comprises:
a connection selection part suitable for electrically coupling an input terminal of a corresponding signal storage section to the signal input circuit in the parallel input period, and electrically coupling an output terminal of a previous signal storage section to an input terminal of a corresponding signal storage section in the serial output period; and
a delay flip-flop suitable for receiving and outputting an output signal of the connection selection part at each preset edge of an operation clock.

8. The semiconductor device of claim 6, wherein the driving unit is enabled in the parallel input period, is disabled in the serial output period, and changes the preset voltage level in the predetermined order when the level determination period is repeated.

9. An operation method of a semiconductor device, the operation method comprising:
driving a plurality of signal lines, which are directly coupled to a plurality of bump pads, to a preset voltage level, receiving voltage levels of the signal lines through a signal input circuit in a parallel manner, and latching logic values of the voltage levels;
serially outputting the logic values latched in the parallel manner in the latching through a probe pad; and
alternately performing the latching and the outputting by a preset number of times, while adjusting the preset voltage level in a predetermined order when the latching is repeated.

10. The operation method of claim 9, wherein the latching comprises:
driving each of the signal lines with driving strength corresponding to the value of a driving control code; and
converting the voltage levels of the signal lines into logic levels through the signal input circuit, and latching the logic levels.

11. The operation method of claim 10, wherein the changing comprises:
repeatedly performing the latching and the outputting until a completion signal is activated; and
adjusting the value of the driving control code in the predetermined order when the latching is repeated, and activating the completion signal when the value of the driving control code is completely adjusted.

12. The operation method of claim 11, wherein the activating comprises:
setting the driving control code to a minimum value at a time of power-up; and
increasing the value of the driving control code at a predetermined interval after the power-up when the latching is repeated, and activating the completion signal in response to a maximum value of the driving control code.

13. The operation method of claim 11, wherein the activating comprises:
setting the driving control code to a maximum value at a time of power-up; and
decreasing the value of the driving control code at a predetermined interval after the power-up when the latching is repeated, and activating the change completion signal in response to a minimum value of the driving control code.

14. The operation method of claim 10, wherein the driving comprises:
driving each of the signal lines to a first voltage level with driving strength proportional to the number of '0s' of the driving control code and inversely proportional to the number of '1s' of the driving control code; and
driving each of the signal lines to a second voltage level with driving strength proportional to the number of '1s' of the driving control code and inversely proportional to the number of '0s' of the driving control code.

15. The operation method of claim 9, wherein, in a normal operation period, a signal outputted from an internal circuit is driven to the signal lines and is outputted to an exterior through the bump pads, and in the normal operation period, a signal applied from an exterior through the bump pads is transferred to the signal lines, a logic value of the signal is determined by the signal input circuit, and the signal is inputted to the internal circuit.

16. An operation method of a semiconductor device having a signal input circuit and a boundary scan test path, the operation method comprising:
performing a boundary scan test by using the boundary scan test path, which includes a scan input probe pad and a scan output probe pad;
performing a DC characteristics test for the signal input circuit, which receives input signals through a plurality of bump pads, wherein the signal input circuit is selectively coupled to the boundary scan test path while the DC characteristics test is performed; and
driving the bump pads to a preset voltage level while the DC characteristics test is performed,
wherein the driving comprises:
adjusting a value of a driving control code in the predetermined order when the level determination period is repeated; and
driving each of the signal lines with driving strength corresponding to the value of the driving control code in the level determination period,
wherein each of the signal lines is driven to a first voltage level with driving strength proportional to the number of '0s' of the driving control code and inversely proportional to the number of '1s' of the driving control code in the level determination period; and
each of the signal lines is driven to a second voltage level with driving strength proportional to the number of '1s' of the driving control code and inversely proportional to the number of '0s' of the driving control code in the level determination period.

17. The operation method of claim 16, wherein the preset voltage level is adjusted in a predetermined order while the DC characteristics test is performed.

\* \* \* \* \*